United States Patent [19]

Morrison, Jr.

[11] Patent Number: 4,461,688

[45] Date of Patent: Jul. 24, 1984

[54] MAGNETICALLY ENHANCED SPUTTERING DEVICE HAVING A PLURALITY OF MAGNETIC FIELD SOURCES INCLUDING IMPROVED PLASMA TRAPPING DEVICE AND METHOD

[75] Inventor: Charles F. Morrison, Jr., Boulder, Colo.

[73] Assignee: Vac-Tec Systems, Inc., Boulder, Colo.

[21] Appl. No.: 161,885

[22] Filed: Jun. 23, 1980

[51] Int. Cl.³ .............................................. C23C 15/00
[52] U.S. Cl. .................................. 204/192 R; 204/298
[58] Field of Search .......................... 204/192 R, 298

[56] References Cited

U.S. PATENT DOCUMENTS

| | | | |
|---|---|---|---|
| 3,956,093 | 5/1976 | McLeod | 204/192 |
| 4,132,613 | 1/1979 | Penfold et al. | 204/192 R |
| 4,180,450 | 12/1979 | Morrison, Jr. | 204/298 |
| 4,282,083 | 8/1981 | Kertesz et al. | 204/298 |

OTHER PUBLICATIONS

J. L. Vossen et al., Thin Film Processes, Academic Press, 1978, pp. 76-79.
D. Hadfield, *Permanent Magnets and Magnetism*, John Wiley & Sons, New York, 1962, pp. 289-291.

Primary Examiner—G. L. Kaplan
Assistant Examiner—W. T. Leader
Attorney, Agent, or Firm—Gerald J. Ferguson, Jr.; Joseph J. Baker

[57] ABSTRACT

A magnetron sputtering device wherein a plurality of magnetic field sources are employed to enhance uniformity of cathode sputtering. Each of the magnetic field sources is independently capable of establishing a discharge at the cathode if the other magnetic field sources are removed so that portions of a V-shaped erosion pattern produced by a primary discharge are also eroded to thus effect the more uniform cathode sputtering.

In one embodiment of the invention, a magnetic field dome of a first polarity is disposed over a second magnetic field dome of the opposite polarity, the domes being disposed over the cathode so that a closed plasma loop is established, the loop including a first sputtering path which extends over the cathode and a second non-sputtering return path which is disposed over the sputtering path and between the first and second magnetic field domes.

The above technique for trapping plasma between the first and second magnetic field domes is unique and has applications to areas other than sputtering.

12 Claims, 17 Drawing Figures

MAGNETICALLY ENHANCED SPUTTERING DEVICE HAVING A PLURALITY OF MAGNETIC FIELD SOURCES INCLUDING IMPROVED PLASMA TRAPPING DEVICE AND METHOD

REFERENCE TO RELATED PATENT APPLICATIONS

This application is related to U.S. patent application Ser. Nos. 935,358, filed Aug. 21, 1978 (now U.S. Pat. No. 4,162,954); Ser. No. 946,370, filed Sept. 27, 1978 (now U.S. Pat. No. 4,180,450); Ser. No. 19,284, filed Mar. 9, 1979; Ser. No. 28,434, filed Apr. 9, 1979; Ser. No. 32,768, filed Apr. 24, 1979; Ser. No. 47,248, filed June 11, 1979, all of the above applications having been filed by Charles F. Morrison, Jr. and assigned to the assignee of the present application. All of the foregoing applications are hereby incorporated herein by reference.

BACKGROUND OF THE INVENTION

This invention relates to sputtering devices and in particular to such devices which are magnetically enhanced.

Disclosed in U.S. Pat. No. 3,878,085 granted to J. Corbani is a magnetically enhanced sputtering device having planar target cathodes. Heretofore, there has been concern over the relatively low utilization of the planar targets. Diode sputtering, which is not magnetically enhanced, gives very uniform erosion of the target, but is only capable of very low deposition rates. The addition of a suitably shaped magnetic field provides approximately 10 fold improvement in rates of sputtering—but the planar target typically erodes through at some point before more than about 30–40% of the total target has sputtered away. With targets of exotic or very pure materials this presents a serious cost problem. When considering the speed, uniformity, film structure, control ease, and freedom from contaminated wash water, etc., the magnetically enhanced sputter technique most often provides the best and most total cost effective films—in spite of the target utilization problem.

Several approaches have been proposed to reduce the target loss, typically these provide for movement of the magnetic field pattern by either mechanical or electromagnetic techniques. They do not appear to represent a totally effective solution to the problem, however, and do not direct one to the fundamental nature of the problem. Another approach has been to shape the target cross-section such that there is material present in proportion to the local erosion rates. This can increase the utilization percentage, but usually at great increase in target cost, to the point that this is not always a satisfactory answer. Magnetically enhanced sputtering is thus an effective coating technology that suffers from one major problem—the erosion pattern.

SUMMARY OF THE INVENTION

It is thus an object of this invention to provide an improved magnetically enhanced sputtering device wherein target utilization is increased.

It is a further object of this invention to provide an improved sputtering device of the above type wherein a plurality of magnetic field sources are employed.

It is a further object of this invention to provide an improved multiple field source sputtering device having a closed plasma loop including two paths, the first of which is a sputtering path disposed over the cathode and the second of which is a non-sputtering return path disposed above the first.

It is a further object of this invention to provide an improved multiple field source sputtering device of the above type having an improved trap for the plasma in the return path.

It is a further object of this invention to provide an improved sputtering device of the above type wherein means are provided for transferring the plasma between the first and second paths.

It is a further object of this invention to provide an improved means for trapping a plasma.

Other objects and advantages of this invention will be apparent from a reading of the following specification and claims taken with the drawing.

BRIEF DESCRIPTION OF THE DRAWING

FIG. 10 is a perspective, plan view of preferred illustrative magnetics for use with the magnetron of FIG. 6 while

DETAILED DESCRIPTION OF PREFERRED EMBODIMENTS OF THE INVENTION

As stated above, magnetically enhanced sputtering is an effective coating technology which suffers from one major problem—that is, the erosion pattern which results in relatively poor target utilization. Accordingly, an explanation will hereinafter be given as to a reasonable mechanism for the formation of observed erosion patterns. This mechanism will then be applied in accordance with this invention in such a manner as to provide a technique for significantly improving target utilization.

Reference should now be made to the drawing where like reference numerals refer to like parts.

Figure 1:
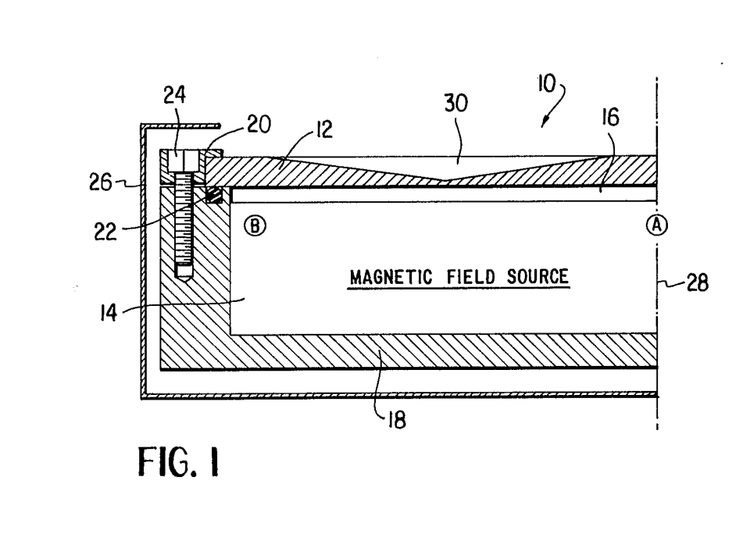
FIG. 1 is a cross-sectional view of an earlier magnetron illustrating the typical V-shaped erosion pattern obtained therewith.

In FIG. 1, there is schematically shown in cross-section an earlier cathode structure 10 including a target 12, a magnetic field source 14 having effective magnetic field line sources of opposite polarity at A and B, a coolant passage 16, a support body 18, a clamp ring 20 for attaching the target to body 18, a seal 22, bolts 24 for attaching the clamp ring to the body and a ground shield 26 where the cathode structure 10 is typically symmetrically disposed with respect to the plane 28 whereby a closed plasma loop symmetrically disposed with respect to plane 28 may be formed. A substrate (not shown) is disposed above the target, the substrate being coated with the sputtered target material.

Figure 2:
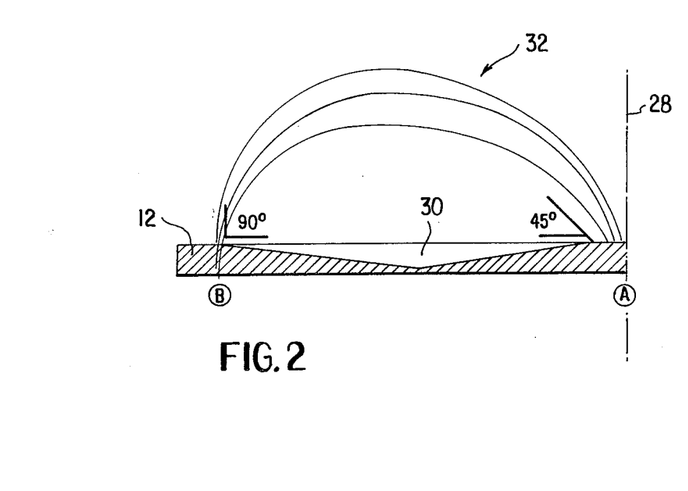
FIG. 2 is a cross-sectional view which illustrates a magnetic field which may be associated with the magnetron of FIG. 1.

In most cases the erosion pattern 30 has been observed to be that shown in FIG. 1, namely a very linear or flat-sided V-shape. In order to improve target utilization the bottom of this "V" must be flattened over as much of the target width as possible. In FIG. 2 is shown an approximate iron filings magnetic picture 32 of target 12 superimposed upon the target erosion picture. It has been assumed a flat magnetic field should be generated above the target to cause a flat erosion pattern. However, very major improvements in the squareness and flatness of the magnetic field system make no change in the fundamental V-shape of the erosion pattern. These more carefully shaped fields do make significant improvements in widening the V-shape to take in almost all of the target area, but they still give a V-shape rather than a flat bottomed U-shape.

It has accordingly been determined the erosion pattern is not controlled by the shape or flatness of the magnetic field in the manner heretofore assumed. Rather, in accordance with the invention, it has been observed the erosion pattern is most probably an electron density/motion resultant and the magnetron's magnetic field usually provides primarily boundary functions. An insight can be gained into this observation by considering the motion of the electrons in the plasma. As is known, electrons in crossed electric and magnetic fields (where the electric field is substantially perpendicular to the cathode surface) assume motions perpendicular to both fields. There is thus generated a circulating current that flows in a closed path about the target surface. This flow of current has associated with it a generated magnet field component that repels the cathode magnetic field 32 above it and cancels the field below it (toward the target surface). This provides a repulsion from the closed lines of force of the cathode field 32 above, and presses the circulating current closer to the target surface. The electrons trapped in this crossed field system collide with sputtering gas molecules such as argon creating argon ions. The electrons plus ions form a plasma that is nearly neutral in net charge. This plasma is an electrical conductor of rather low impedance. There is thus relatively little of the applied voltage across it. Most of the applied voltage is beneath the plasma-compressed against the cathode surface. The dark space is thus very short, being on the order of one millimeter thick. The overhead magnetic lines of force 32 from the cathode magnet 14 thus force the circulating current close to the target 12, and the perpendicular portions of this field provide side boundaries for the plasma, establishing its lateral containment. Lines of force at approximately 45° to the target surface mark the center boundary of the erosion and at 90° approximately mark the external boundary as shown in FIG. 2.

If several insulated copper wires were placed over a table top parallel to each other and current passed through them in the same direction, it would be observed that they attract each other and tend to cling together. This attraction is caused by the magnetic field generated about the wires by the current flow. In the plasma electrons are moving in the closed path much as if they were in wires. The result is a gathering similar to the clinging of the wires. This is a pinch effect. The electrons can crowd closer to each other than electrostatic repulsion would normally permit due to the presence of the positive ions in the plasma.

It is observed that an electron/ion distribution increases quite linearly from the outer magnetic bound toward the center of the V-shaped erosion pattern. This would seem to predict a much steeper than linear erosion pattern in that it would predict a semicircular plasma cross-section (which has been observed) with the center compounding the effect from both sides and top. Although such plasma densities have been observed, they do not result in a non-linear erosion pattern. The linear erosion pattern observed becomes reasonable when it is realized the voltage is almost all at the bottom of the plasma cloud, and the mean free path in the plasma is very short. Thus only a very thin layer close to the target contributes meaningfully to the erosion, but all of the plasma height contributes to the plasma brightness that it is seen as one looks directly at the target through the plasma. Thus, since there is linear gradient of current along a radius of the pinch shaped plasma toward the center of the V-shaped erosion pattern, it may be assumed that for sputtering purposes only a thin slice that extends parallel to a radius accounts for the linear erosion shape. The location of the inner and outer edges of the erosion pattern are defined by the cathode magnetic field 45° and 90° lines as discussed above with respect to FIG. 2 while the erosion pattern inside these is caused by the circulating density pattern.

Figure 3:
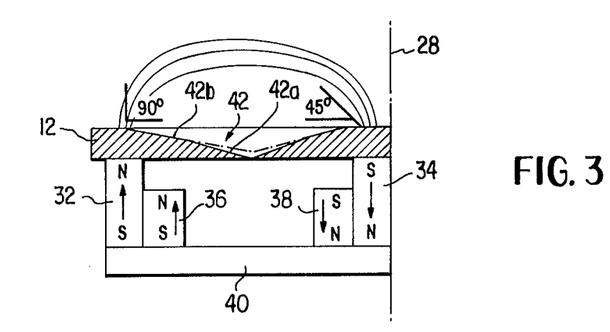
FIG. 3 is a cross-sectional view of an earlier magnetron which illustrates the principle of the subject application, the cross-hatch lines being omitted from the magnetic field source structure for purposes of clarity.

Examination of the conventional magnetron cathode field lines 32 shows them to originate almost as if from line sources A and B in FIG. 2. Very major structural changes in the magnetic structure 14 can be effected without significantly changing this aspect of the pattern. The location of A and B can be changed and thus the width of the erosion pattern. But this does not change the erosion shape. The shape of the magnetic field defines its edges. There are both field strength and angle requirements in defining edge locations, but these only result in defining the width and placement of the V-shaped pattern. This does not imply that field shape and strength are not without effect. However, the effects are primarily in terms of stability, efficiency, minimum gas pressure for starting and full power operation, minimum power for full width erosion, etc. They do not lead to significantly more uniform erosion. It has been observed the problem of nonuniform erosion can be worsened by adding to the complexity of the magnetic field. By extending the magnets inward to provide effective outer magnets 32 and 34 and inner magnets 36 and 38 connected by pole piece 40 (See FIG. 3 and FIG. 15 of aforementioned co-pending application Ser. Nos. 946,370 and 19,284.), applicant has been able to compound the boundary problem and provide additional boundaries inside the usual set. This provides a gull wing erosion section or pattern 42 as shown in FIG. 3 that suggests the inner magnet system 36, 38 has established an additional V-shape which is added to the original one to increase the erosion rate proportionately in the center of the pattern. The cathode of this design is extremely stable and exhibits very low impedance. The plasma is very intense, covering what seems visually to include the center and sides. However, the target suffers this gull wing shaped erosion and leaves a wide center and edge strip uneroded. The narrowness of the erosion can be understood for the inner magnets 36, 38 force the primary field from magnets 32, 34 to stand up very steeply thus causing the primary field to reach the critical 45° and 90° angles closer to the center of the erosion pattern. The lines of force from the shorter magnets 36, 38 are able to pass through the target at relatively small angles below certain critical angles so they do not limit other than the internal V-shaped pattern 42a. The fundamental V-shaped pattern 42b, which has been extended to the center by phantom lines is produced in spite of the inner one 42a. Indeed, the erosion looks like the summation of two V-shaped patterns 42a and 42b of different width and depth, but the same center. Other magnetic source configurations have also been observed to give similar effects. In each case there was a multiple source of lines of force—such that they did not seem to issue from a single point—as in FIG. 3. The significance of this for applicant was there is some freedom to combine V-shaped erosion patterns within a simultaneous erosion and thus the possibility of significantly increasing target utilization without the limitations of the other methods in use.

Figure 4A:
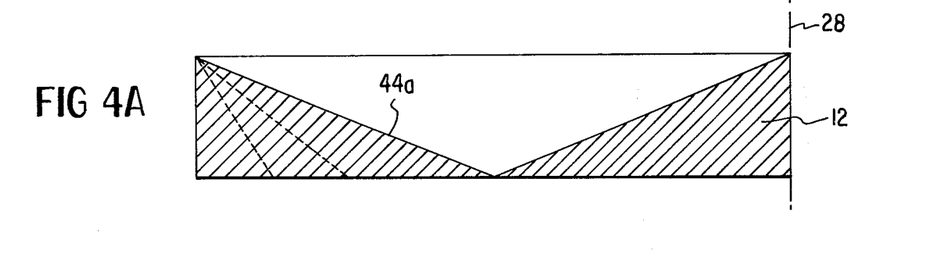
FIGS. 4A–4E are cross-sectional views of targets which illustrate the improved uniformity of sputtering thereof obtained in accordance with the invention.
Figure 4B:
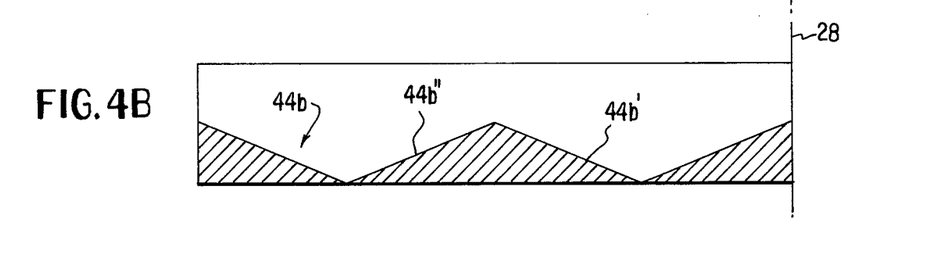
Figure 4C:
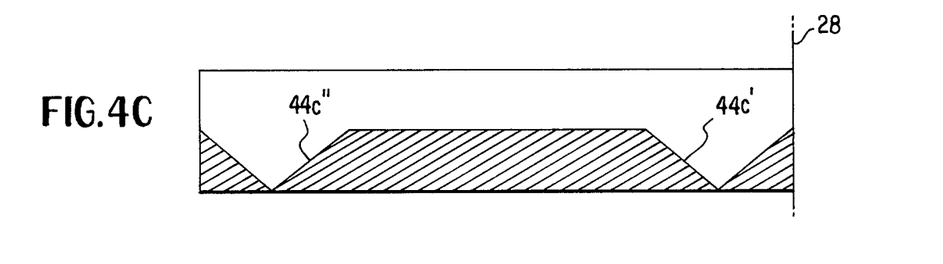
Figure 4D:
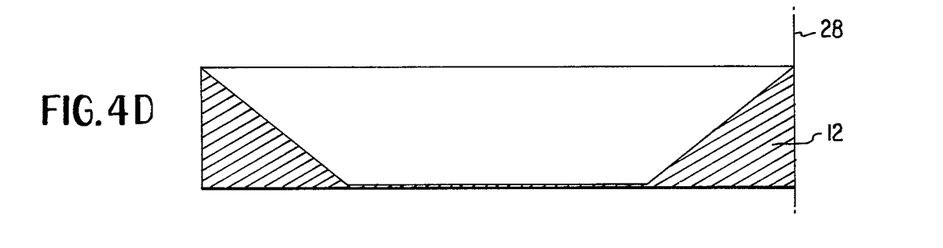
Figure 4E:
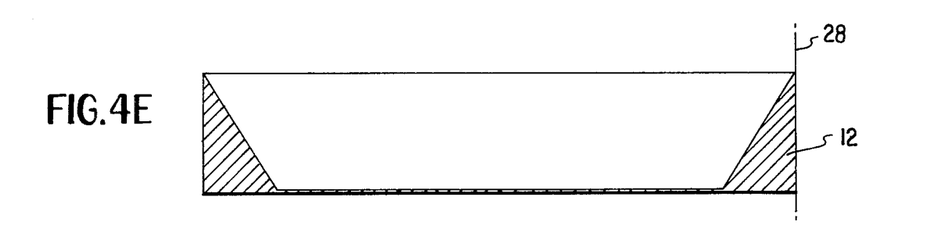

The algebra or rules of addition and interaction of the various fields for increasing target utilization are as follows. First, the lines of force of each field cannot be crossed. There are also field projection limitations as the magnetics become smaller. Thus rather large steps are preferred. Assuming the erosion patterns are correctly weighted, the simplest algebra appears to be that shown in FIGS. 4A–4E. Here the fundamental V-shape 44a takes one-half of the total target cross-section as shown in FIG. 4A. The second order V-shape 44b would be an inner 44b' and outer 44b'' set of V-shapes. These are the biggest V-shapes that can be taken from 44a. Each of these would ideally take $12\frac{1}{2}\%$ of the total cross-section to bring the total resulting from the combination of the second order and fundamental V-shapes to 75% of the total cross-section as shown in FIG. 4D. If the remainder is divided into the biggest V-shape that can be taken, $6\frac{1}{4}\%$ of the total cross-section is obtained for each of the two third order V-shapes 44c' and 44c'' shown in FIG. 4C. This produces $87\frac{1}{2}\%$ utilization of the total cross-section as shown in FIG. 4E. The center cannot be forced to zero width, so these figures are unobtainable for a practical system, but they do suggest one of the practical erosion algebras and its approximate result.

It can be seen the fundamental V-shape 44a must enclose all of the rest of the sets. Lines of force cannot be crossed; thus each successive V-shape must be smaller than the previous one it fits into. The system shown in FIGS. 4A–4E is only one of the many possible ones although it is preferred in that it could result in a very high, if not optimum, percentage of target utilization.

Figure 5:
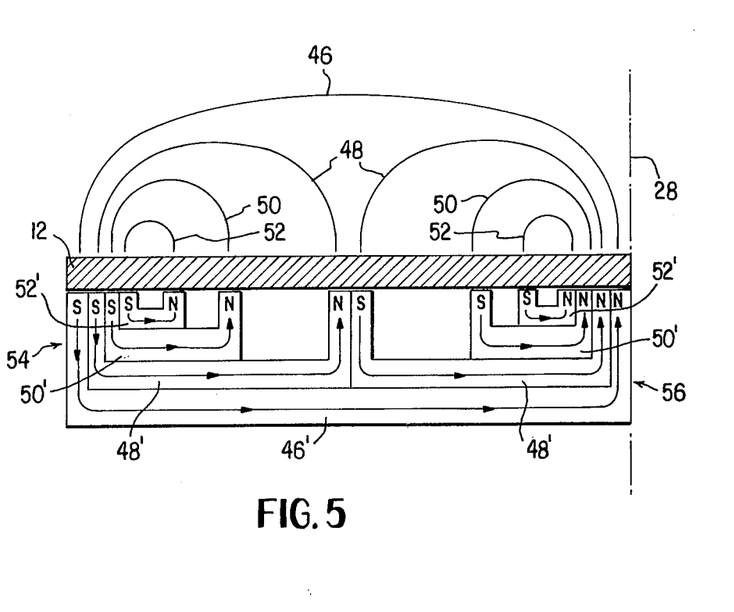
FIG. 5 is a cross-sectional view of an improved illustrative magnetron in accordance with the invention for effecting the uniform sputtering illustrated in FIGS. 4A–4E, the cross-hatch lines being omitted from the magnetic field source structure for purposes of clarity.

Referring to FIG. 5, there is illustrated a magnetic schematic for generating a fourth order extension of the third order illustration of FIG. 4. Thus, in FIG. 5, there is shown the lines of force of a primary magnetic field 46 generated by a source 46' which may, for example, comprise a U-shaped magnet. Primary field 46 corresponds to the primary V-shape 44a of FIG. 4A. The second, third and fourth magnetic fields 48, 50 and 52 are respectively generated by second, third and fourth magnets 48', 50' and 52' and correspond to respective second, third and fourth order V-shapes.

In general, there may be N orders of a first and further magnetic field sources where n equals the number of a particular order such that n=1, 2, 3, ..., N, where N is at least 2. In FIG. 5, there are 4 orders of sources (N=4) where the first order source (n=1) comprises magnet 46', the second order comprises magnets 48', the third comprises magnets 50' and the fourth order magnets 52'. The magnets or field sources respectively provide dome-like fields 46, 48, 50 and 52.

As can be seen in FIG. 5, the dome-like field 48 associated with one of the field sources 48' of the second order (n=2) may be disposed under at least a portion of one-half of the first dome-like field 46. Moreover, the other dome-like field 48 associated with the other field source 48' of the second order may be disposed under at least a portion of the other half of the first dome-like field so that portions 44b' and 44b'' (FIG. 4B) are removed from both sides of the V-shaped erosion patterns 44a of FIG. 4A.

In general, the dome-like field associated with one of the field sources of the $n^{th}$ order (if N>2) may be disposed under a portion of one of the two dome-like fields of the $(n-1)^{th}$ order and the dome-like field associated with the other field source of the $n^{th}$ order may be disposed under a portion of the other of the two dome-like fields of the $(n-1)^{th}$ order so that the $n^{th}$ order field sources remove portions on both sides of the V-shaped erosion pattern 44 which are outside the portions removed by the $(n-1)^{th}$ order field sources.

Each of the magnets 46'-52' effectively produces its own V-shape and the resulting erosion is the weighted summation of these V's. The relative magnitude of each V-shape height-wise is a function of the strength and shape of its associated field. FIGS. 4A–4E show the theoretical resulting erosion patterns and their sums. The discharges must be capable of independent existence if their magnetics were isolated—that is, the strength and shape of the fields 50, for example, generated by U-shaped magnets 50' must be such that, if magnets 46', 48' and 52' were removed, the discharges associated with fields 50 would be sufficient to produce their associated V-shaped erosion patterns. In this regard, the strength of the magnets 48', 50' and 52' should be such that they are not only capable of attracting lines of force thereto but that they are capable of establishing the above-mentioned discharges capable of independent existence. (Although there is some structural similarity between the embodiments of FIGS. 23–28 of the above-mentioned co-pending U.S. application Ser. No. 19,284 and the embodiments of FIGS. 4 and 5, any improvement obtained with the embodiments of FIGS. 23–28 was not understood in the terms described hereinbefore for the present invention.) Each of the discharges capable of independent existence can receive assistance in getting started from other discharges, but each must perform its share of the overall task of eroding the target. The magnetics fields 46–52 must not combine to generate a resultant. If they do, the erosion pattern of FIG. 1 again results.

With respect to smaller cathodes (5" or less, for example), the complex field of FIG. 5 renders very difficult field projection through very thick targets. However, the utilization can be increased to approximately 70–80% for such targets up to $\frac{1}{4}"$ thick. Further, the four order field of FIG. 5 appears to be too high an order for 5" cathodes, but works on larger ones. In the 5" wide target units the 3rd order modification is all that seems practical at this time. Moving to 6" and 7" targets provides room for fourth and fifth order modifications.

Figures 6, 7:
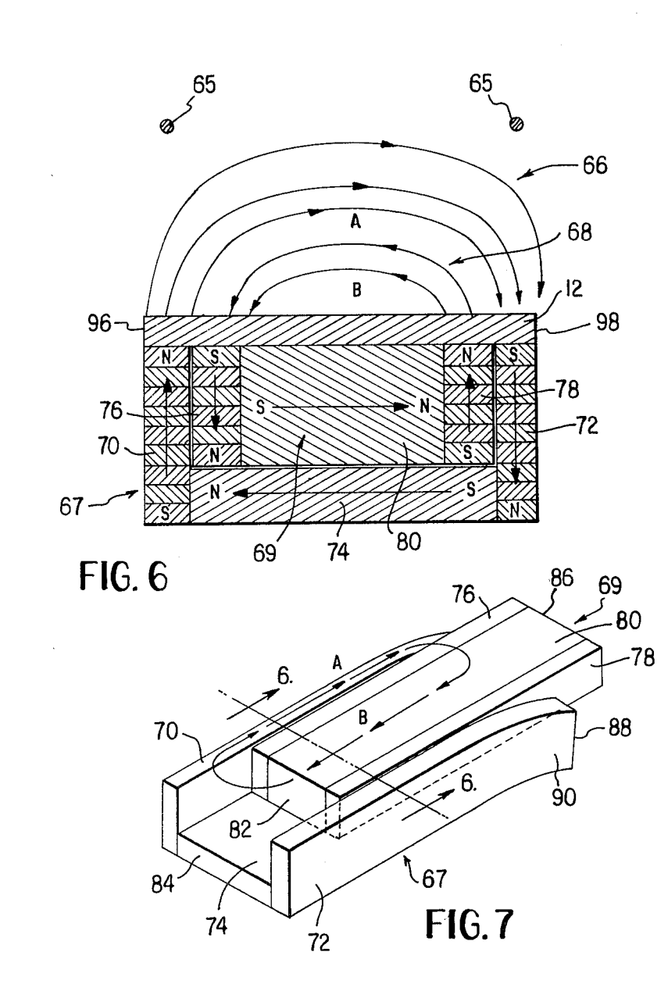
FIG. 6 is a cross-sectional view of an illustrative modified magnetron in accordance with the invention.
FIG. 7 is a perspective view of illustrative magnetics for use with the magnetron of FIG. 6.

Reference should now be made to FIG. 6 wherein an algebra of negatives is illustrated as opposed to the algebra of positives illustrated in FIGS. 4 and 5. In this embodiment a N-S magnetic field 66 dome is placed over a S-N magnetic field dome 68. The N-S dome 66 is established by first magnetic field source 67 comprising magnets 70–74 while the S-N dome 68 is established by a second magnetic field source 69 comprising magnets 76–80, it being understood the term "dome" or "dome-like" as used in the claims extends to all dome-like configurations whether curved or rectangular.

The orientation of the fields of domes 66 and 68 is in part determined by the field projection parameters of the particular magnetic materials comprising magnets 70–80 and of the circuits 70–74 and 76–80. If the field projection directionality is sufficiently strong, the lines of force will be launched into space in that direction with sufficient force that they will travel a significant distance before the choice of return pole location significantly effects their trajectory. In this way most of the flux from magnet 70, for example, is pushed past the adjacent return magnet 76 so that it is attracted to more distant return magnet 72 at the other side of target 12. Similar considerations apply to the adjacent magnets 48' of FIG. 5. The desired field projection directionality is preferably obtained with oriented ferrite magnets where oriented ferrite particles are dispersed in a low permeability binder such as rubber or plastic.

The presence of these particles, which are capable of producing a very strong magnetic field, in a low permeability (less than 10, for example) binder such as rubber or plastic, is apparently effective in providing the requisite field projection directionality. Further, the oriented ferrite impregnated plastics make practical multi-part magnet systems in which there is no need for interconnecting high permeability connections. The oriented ferrite magnets may comprise a stack of ferrite impregnated strips or tapes such as PL-1.4 H made by Minnesota Mining and Manufacturing Co. Such stacks are illustrated for magnets 70, 72, 76 and 78 of FIG. 6 but are preferably used for all magnets of the present invention.

The 180° crossed magnetic field arrangement of FIG. 6 provides an overhead, non-sputtering return path at A in which electric field polarity is fixed, no anode internal to the loop being required such as is illustrated at FIG. 10 of above-mentioned co-pending U.S. application No. 28,434. A sputtering path is provided at A. In order to better understand the establishment of the sputtering path at A and the overhead, non-sputtering return path at B, it should first be noted that in a simple crossed electric and magnetic field—as at either A or B, electron motion occurs in or out of the plane of the drawings. Circulating current electrons in B pinch in the manner described hereinbefore with respect to FIG. 3. This plasma would thus be forced down against target 12. Electrons in A would also pinch, and because they are moving in the opposite direction from those in B, in the opposite direction magnetic field, they will also tend to move downward. In B, the pinch neutralizes the magnetic field below itself, and repels the field above. This happens in A, also—until this pinch moves down to where it starts to encounter the B field. Now, instead of neutralizing the B field, there is repulsion. These electrons thus experience repulsion from both above and below, and they are uniquely trapped between the two fields. The pinch current in B is forced against the target until the electrostatic repulsion of the electrons (with their limited exposure due to the positive ions in the plasma) counters the magnetic repulsion from above. Control over this dark space thickness is thus had only by the field strength somewhere in the field. By providing the reversed, double fields A and B, the plasma is firmly trapped in the space therebetween, it being possible to lengthen this space nearly at will. This technique of plasma trapping thus has applications other than establishing a return path in a sputtering device.

In FIGS. 6 and 7, it can be seen that simple crossed field electron motion is one way-top at A and the other way-bottom at B. In order to change from flux stream A to stream B, a transfer method that is rather elementary is that of terminating the one field in an area completely surrounded by the other. This is easily done where the inside stream B transfers to the overhead return stream A as shown in FIG. 7 where magnetic field source 69 is terminated at 82 inside the termination 84 of magnetic field source 67. Where the overhead stream A transfers to the inside sputtering stream B, the end 86 of source 69 is disposed beyond the end 88 of source 67. Further, the source 67 is rounded downward as indicated at 90 in FIG. 7.

Figure 8:
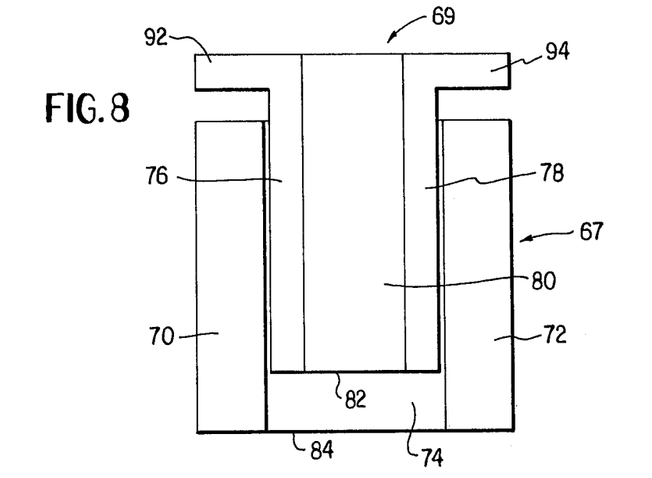
FIG. 8 is a plan view of further illustrative magnetics for use with the magnetron of FIG. 6.

Another embodiment for transferring from the overhead stream A to inside stream B is to outwardly flare magnets 76 and 78 as indicated at 92 and 94 in the plan view of FIG. 8, the source 69 extending beyond source 67. The flare may be other than the right angle flare shown.

Figure 10:
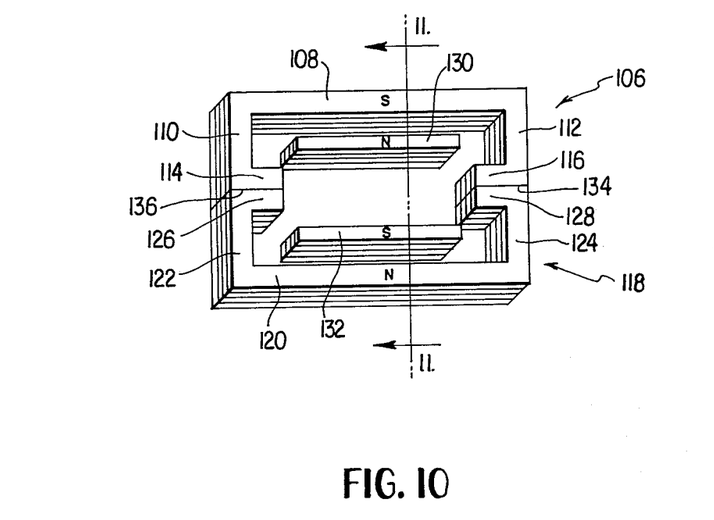
Figure 11:
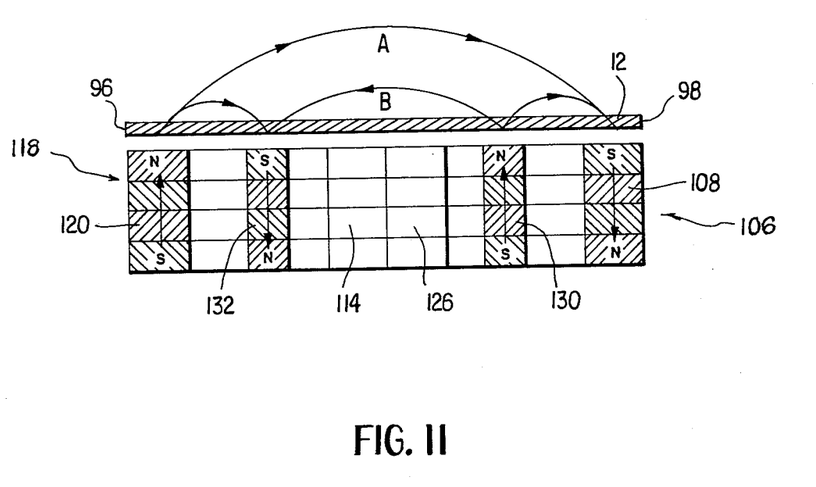
FIG. 11 is a cross-sectional view taken along the line 11—11 of FIG. 10.

A preferred embodiment for transferring from the overhead stream A to inside stream B is illustrated in FIGS. 10 and 11, FIG. 10 being a perspective, plan view of the magnetics without the cathode while FIG. 11 is a cross-sectional view taken along the line 11—11 of FIG. 10 where the target 12 is also illustrated. This magnetics comprises a first C-shaped magnet 106 having a longitudinally, extending leg 108, two laterally extending legs 110 and 112 and two inner, longitudinal legs 114 and 116. A second C-shaped magnet 118 includes longitudinal leg 120, lateral legs 122 and 124 and inner lateral legs 126 and 128 where the inner lateral legs of magnets 106 and 118 are disposed adjacent one another. As can be seen in FIGS. 10 and 11, the direction of the flux in magnet 106 is opposite to that in magnet 118. The magnetics of FIG. 10 further includes longitudinally extending magnets 130 and 132, these magnets being respectively disposed within and spaced from C-shaped magnets 106 and 118 whereby the magnetic field indicated in FIG. 11 is established. Although there are small plasma leaks out the ends 134 and 136, the behavior of the magnetics of FIG. 10 is good.

Figure 9A:
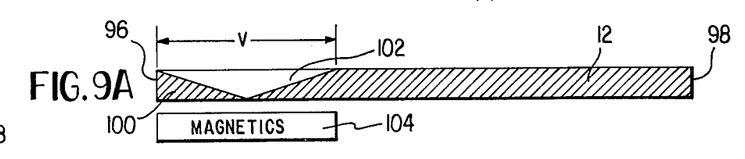
FIGS. 9A–9C are cross-sectional views of a cathode which illustrate the sputtering thereof when the cathode is relatively movable with respect to the magnetics of FIG. 6.
Figures 9B, 9C:
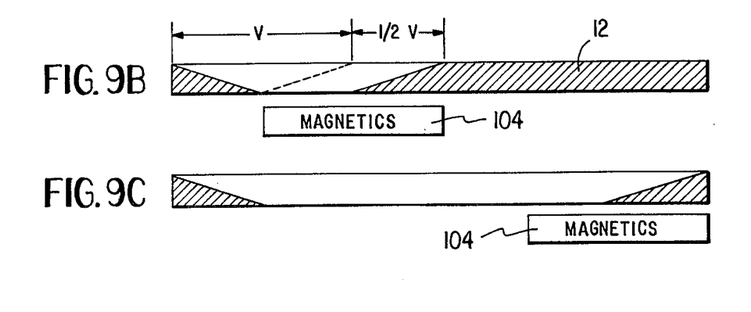

Because the lower plasma stream B consumes most of the voltage in its dark space, there is an interplay that keeps the upper and lower streams at the same general level. Also, the lowered voltage on the upper stream A reduces the ion loss from that path. Thus, the return path A saps almost no power (no current flow) and the erosion creating or sputtering lower stream B does all the work. This produces the V-shaped erosion pattern of FIG. 2. Clamping only at the sides 96, 98 of target 12 (see FIGS. 6 and 9A) gives the freedom to initially erode off the end 100 to improve utilization. FIG. 9A shows this initial V-shaped erosion 102 of the target, which is effected by the magnetics 104, the magnetics 104 comprising field sources 67 and 69 of FIG. 6 or the magnetics of FIGS. 8 or 10. When this becomes very thin at the bottom of the V-shape, the target and the magnetics 104 can be moved relative to one another by one-half of the width of the initial V-shape 102 as indicated in FIG. 9B. This will change slightly the directional distribution from the target, but because the dark space is pressed to the target surface—almost independent of its shape, the erosion rates will again be the same in cross-section. Further moves by $\frac{1}{2}V$ are shown in FIG. 9C until an extremely complete utilization of the target results.

The reverse magnetic polarity return of FIGS. 9A–9C with relatively movable target and magnetics is therefore capable of solving the utilization problem even more completely than the all-in-the-target-plane magnetron with complex fields as shown in FIGS. 4 and 5. With the complex fields of FIGS. 4 and 5 applied to the erosion path of the reverse polarity return unit of FIGS. 6, 8 or 10, utilizations of an entire target can be achieved which correspond to that indicated for the half cross-sections of FIG. 4 for (a) there is no minimally eroded center which occurs at the center plane 28 of FIG. 4 and (b) there are no curved ends with their uneroded corners.

Many of the embodiments of this invention may use ferrite magnets in part such as those made by Arnold Magnetics, Inc. or Crucible Iron and Steel Co. Also, many of the embodiments described herein may use more conventional magnets such as alnico ferromagnetic magnets in part but seldom with the convenience and practicality of the preferred materials. Electromagnets may also be employed, but they also are subject to the same objection. In any event, the above magnet means such as permanent magnets or electromagnets are preferably used in the subject application although magnetic means such as appropriately selected pole plates may also be used in conjunction with the magnet means discussed hereinbefore.

The magnetic structures of the present invention may be employed with planar cathodes which are circular or oblong. Oblong cathodes may be rectangular, elliptical or oval. Also, the planar cathode may be annular. Further, the planar cathode may include non-linear portions such as the concave portions shown in the cathodes of FIGS. 5 and 7 of U.S. Pat. No. 3,878,085. In addition to planar cathodes, cylindrical, conical, endless belt, etc. cathodes may also be employed. Also, as the cathode is sputtered, there may be a tendency for it to erode unevenly. Nevertheless, the cathode may still be considered planar, cylindrical or whatever its original shape was. Further, contoured surfaces may be imparted to the cathode so that it is thicker in areas of greatest expected erosion. Again, such a cathode is to be considered planar, cylindrical, etc. depending upon its general configuration prior to sputtering thereof.

The target material to be sputtered may or may not be the cathode of the device. If not, it may be clamped to the cathode by a clamp similar to those illustrated in FIG. 1 where the clamp may also be employed to secure the cathode within the sputtering device.

Regarding the anode 65 shown in FIG. 6, for example, it is usually so-called because sputtering systems are typically self-rectifying when an AC potential is applied. Hence, although the term anode is employed in the following claims, it is to be understood that it may be any other equivalent electrode in the system. Further, the anode can be the container wall of the sputtering device. DC, low frequency AC (60 Hz, for example) or industrial radio frequencies, such as 13.56 MHz or 27.12 MHz, may be applied across the anode and cathode. To effect RF isolation, the anode is almost always the container wall when these high frequencies are employed although it is quite often employed as the anode when DC is employed.

As to the gas employed in the system, it may be either active or inert depending upon the type of sputtered layer desired. It should be further noted that the principles of the present invention can be applied to sputter etching.

It is to be understood that the above detailed description of the various embodiments of the invention is provided by way of example only. Various details of design and construction may be modified without departing from the true spirit and scope of the invention as set forth in the appended claims.

What is claimed is:

1. A magnetically enhanced sputtering device for coating a substrate with material sputtered from a sputtering surface of a layer of said material, said sputtering device comprising:

means for establishing an electric field, at least some of the lines of force of which are substantially perpendicular to said sputtering surface;

a first magnetic field source for providing a first dome-like magnetic field over said sputtering surface so that a plasma associated with the first field would produce a substantially V-shaped erosion pattern from the layer if only the first field were over the sputtering surface; and at least one further magnetic field source for providing a further dome-like magnetic field within said first dome-like magnetic field for modifying said V-shaped erosion pattern where each of said first and further magnetic field sources is capable of sustaining a sputtering electrical discharge in the absence of the other magnetic field sources to thereby enhance the uniformity of sputtering of the layer.

2. A sputtering device as in claim 1 including two of said further magnetic field sources, the dome-like field associated with one of them being disposed under at least a portion of one-half of the first dome-like field while the dome-like magnetic field associated with the other one being disposed under at least a portion of the other half of the first dome-like field so that portions are removed from both sides of said V-shaped erosion pattern.

3. A sputtering device as in claim 1 where there are N orders of said first and further magnetic field sources, where n equals the number of a particular order such that n=1, 2, 3, ..., N and N is at least equal to 2, the first order (n=1) consisting of said first field source and each of the other orders consisting of at least two of said further field sources, the dome-like field associated with one of the field sources of the second order (n=2) being disposed under at least a portion of one half of the first dome-like field and the dome-like field associated with the other field source of the second order being disposed under at least a portion of the other half of the first dome-like field so that portions are removed from both sides of said V-shaped erosion pattern and the dome-like field associated with one of the field sources of the $n^{th}$ order (if N>2) being disposed under a portion of one of the two dome-like fields of the $(n-1)^{th}$ order and the dome-like field associated with the other field source of the $n^{th}$ order being disposed under a portion of the other of the two dome-like fields of the $(n-1)^{th}$ order so that the $n^{th}$ order field sources remove portions on both sides of said V-shaped erosion pattern which are outside the portions removed by said $(n-1)^{th}$ order field sources.

4. A sputtering device as in claims 1 or 3 where the first and further magnetic fields intersect said layer at the approximate edges of the fields.

5. A sputtering device as in claims 1 or 3 where said plasma forms a closed loop substantially parallel to said sputtering surface.

6. A sputtering device as in claims 1 or 3 where said first and further magnetic field sources comprise oriented ferrite particles dispersed in low permeability binders.

7. A sputtering device as in claims 2 or 3 comprising at least one additional magnetic field source for providing an additional magnetic field above said first magnetic field, the polarity of said first and additional magnet fields being opposite to one another so that a sputtering plasma path is established between the first magnetic field and the sputtering surface and a non-sputtering return plasma path is disposed between the first and additional magnetic fields.

8. A method for coating a substrate with material sputtered from a sputtering surface of a layer of said material, said method comprising:
   establishing an electric field, at least some of the lines of force of which are substantially perpendicular to said sputtering surface;
   providing a first dome-like magnetic field over said sputtering surface so that a plasma associated with the first field would produce a substantially V-shaped erosion pattern from the layer if only the first field were over the sputtering surface; and
   providing a further dome-like magnetic field within first dome-like magnetic field for modifying said V-shaped erosion pattern where each of said first and further magnetic fields is capable of sustaining a sputtering electrical discharge in the absence of the other magnetic fields.

9. A method as in claim 8 where there are N orders of said first and further magnetic fields, where n equals the number of a particular order such that $n=1, 2, 3, \ldots, N$ and N is at least equal to 2, the first order (n=1) consisting of said first field and each of the other orders consisting of at least two of said further fields,
   one of the dome-like fields of the second order (n=2) being disposed under at least a portion of one half of the first dome-like field and the other dome-like field of the second order being disposed under at least a portion of the other half of the first dome-like field so that portions are removed from both sides of the V-shaped erosion pattern and
   one of the dome-like fields of the $n^{th}$ order (if N>2) being disposed under a portion of one of the two dome-like fields of the $(n-1)^{th}$ order and the other dome-like field of the $n^{th}$ order being disposed under a portion of the other of the two dome-like fields of the $(n-1)^{th}$ order so that the $n^{th}$ order fields remove portions on both sides of said V-shaped erosion pattern which are outside the portions removed by the said $(n-1)^{th}$ order fields.

10. A method as in claims 8 or 9 where the first and further magnetic fields intersect said layer at the approximate edges of the fields.

11. A method as in claims 8 or 9 where said plasma forms a closed loop substantially parallel to said sputtering surface.

12. A method as in claims 8 or 9 comprising providing an additional magnetic field above said first magnetic field, the polarity of said first and additional magnet fields being opposite to one another so that a sputtering plasma path is established between the first magnetic field and the sputtering surface and a non-sputtering return plasma path is disposed between the first and additional magnetic fields.

* * * * *